United States Patent [19]
Hait

[11] Patent Number: 5,835,246
[45] Date of Patent: Nov. 10, 1998

[54] ADDRESSABLE IMAGING

[75] Inventor: John N. Hait, Missoula, Mont.

[73] Assignee: Rocky Mountain Research Center, Missoula, Mont.

[21] Appl. No.: 409,267

[22] Filed: Mar. 12, 1995

[51] Int. Cl.$^6$ .................................................. G03H 1/08
[52] U.S. Cl. .................................. 359/9; 359/1; 359/10; 365/216
[58] Field of Search .................................. 359/1, 3, 4, 7, 359/9, 10, 17, 22, 139, 578, 579; 365/64, 215, 216, 234; 369/101, 103, 106; 364/822

[56] References Cited

U.S. PATENT DOCUMENTS

| 5,093,802 | 3/1992 | Hait | 364/807 |
| 5,515,183 | 5/1996 | Hashimoto | 359/9 |
| 5,521,724 | 5/1996 | Shires | 359/22 |

*Primary Examiner*—Paul M. Dzierzynski
*Assistant Examiner*—Darren E. Schuberg
*Attorney, Agent, or Firm*—Leonard D. Schappert

[57] ABSTRACT

A means, method and apparatus for producing a parallel addressable set of images by modulating a set of input beams with addressing information, and projecting the energy from a three-dimensional array of first pixel locations which decode in parallel to produce an interference image at the location of a second three-dimensional array of pixel locations, energizing at least one of the second pixels. Each image corresponds with an input address. A subset of addresses, projection surface configurations, and images exhibit useful synergistic relationships. These are used to address a ROM, RAM, or content addressable memory, provide a visual display of selected images, iterate in a series to produce four dimensional computing, integrate information from multiple energy forms, and accomplish signal processing and channel switching.

2 Claims, 6 Drawing Sheets

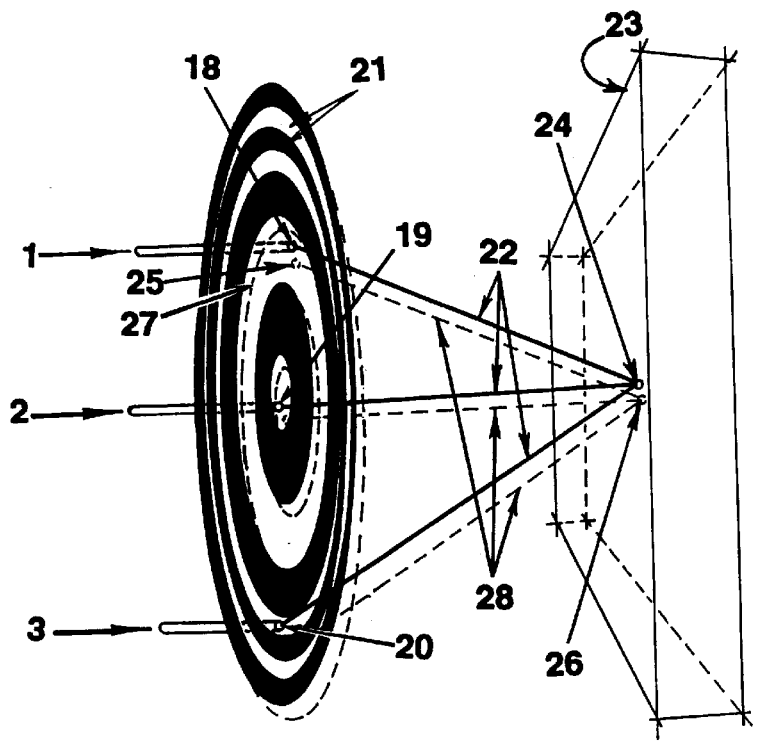
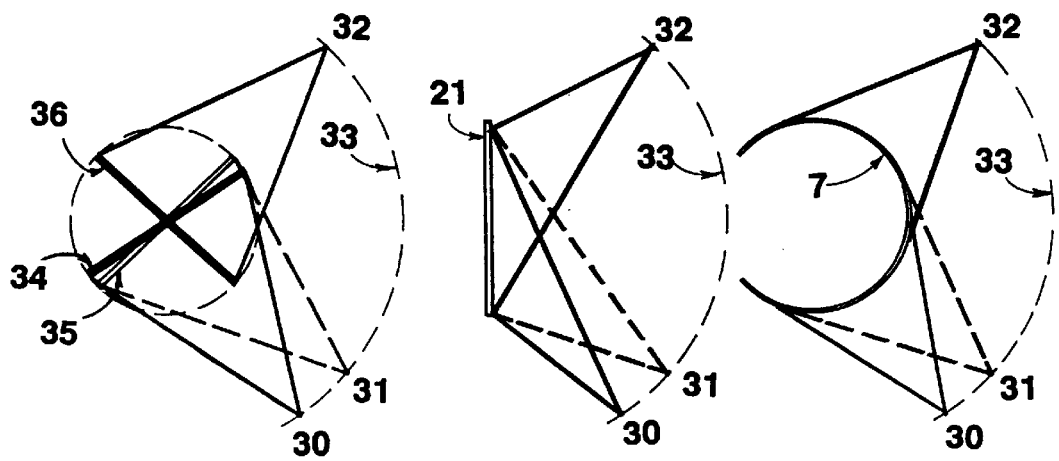
Fig. 3
Fig. 4A    Fig. 4B    Fig. 4C

ADDRESSABLE IMAGING

BACKGROUND OF THE INVENTION

1. Technical Field

The present invention relates to optical computing, optical memories, optical signal processing, optical scanning, and control of low power beams of wave-type energy and images using electromagnetic waves, acoustical waves, and moving particles that exhibit wave properties.

2. Background Art

The basic concept of addressing interference images is new, and will be applied to various tasks in new ways. The background art does not use addressable imaging at all, but will be cited herein for comparison.

The present invention uses image addressing to accomplish address decoding for optical memories. The prior art uses mechanical, electro-optical, and acousto-optical methods. The primary reason is that the prior art was invented within an electro-optical environment. Consequently, that electronics must play a major role in making the inventions of the prior art operational.

The present invention has been invented primarily for a photonic environment. A photonic environment could be here described as a general pattern of engineering thinking that centers on the capabilities of photonic processes. In contrast, an electronic environment would be one where an engineer who has a problem to solve would generally choose devices and processes in his field for solving that problem. That is, he would choose electronic methods. A mechanical environment would be one wherein an engineer would attempt to solve that same problem mechanically. An electro-optic engineer would select electro-optic methods. Like wise an engineer working in a photonic environment would try to solve the problem using strictly optical or photonic methods.

The physical principles employed in the production of the present invention have been selected to enhance and complement the operation of completely photonic processes such as the logic gates described in my previous U.S. Pat. No. 5,093,802. Such photonic logic is based on the use of interference between light beams. To accomplish complex interference logic, the phase, intensity, direction and other parameters of light must be predetermined. In order to guarantee that each item works the way it is supposed to work, the instantaneous relationships between wave packets and pulses and within groups of photons must occur as predicted to accomplish each process.

The prior art relies on internal electro-optical methods that lack the precision required by interference methods. While the present invention will operate with electro-optical, mechanical or acoustic devices, the substantially exclusive use of photonic devices with the present invention is preferred because electro-optical, mechanical and/or acoustical devices are too slow to compete effectively with photonic devices. In fact, electrons are too slow. Photons travel at the speed of light, and that is one reason for the present invention's superiority to the prior art. In cases where one must use non-electromagnetic waves, the present invention enhances their use also.

A typical prior art example is Hulgnard et al, U. S. Pat. No. 3,936,139, which uses an "acousto-optical deflector element" shown as item 20 in his FIG. 3, and described in col. 6, lines 18–31, col. 7, lines 36–57, and col. 8 lines 1–9. Here he describes his method that corresponds to address decoding by saying, "two deflection operations are therefore required: a first, using the deflector $D_1$, to choose the values of the angle [theta] which corresponds to the page in question."

Another example is Jenkins et al, U.S. Pat. No. 5,121,231, which essentially is a very complex way of shining an array of little lights onto different parts of a hologram, one light at a time, in order to retrieve information from the hologram. The little lights are shown in his FIG. 5 as items 14a and 14b in light array 14. Each light illuminates the hologram 20 from a different perspective, producing a different output. However, the addressing of this information is actually accomplished by turning on the individual lights 14a or 14b. In order to convert an address of any kind to access a certain memory location, the address decoding will have to take place outside of his invention, because no provisions are made for selecting a specific little input light by the decoding of an input address.

Jenkins et al. is shown to be electronics-oriented, rather than completely photonic-oriented by his reliance on SLMs (spatial light modulators), by his long discussion of them, and by their use within his invention. See col. 4 lines 41–48, "Source Array" discussion in col. 10 lines 7–10, 47–49, 60–63, and the long discussion "5. Spatial Light Modulators" col. 16, line 22 to col. 18 line 47.

Another major difference between Jenkins et al and the present invention is his consistent use of "means for providing an array of coherent light sources that are mutually incoherent" which forms the basis of each of his independent claims: 1, 15, 19, 35, 40, and 64. The present invention addresses individual images that are selected by choosing a different address for each image using coherent energy from each address input pixel, whereas Jenkins uses "incoherent" signals to differentiate between one set of information being accessed and another set of information being accessed.

The present invention uses sequential image addressing (but not necessarily sequential addresses,) to accomplish scanning, whereas the prior art generally relies on mechanical and electro-optical methods. The present invention provides for the projection of image addresses from a three-dimensional surface. When used as a display, it produces images through address selection from a set of available images, concepts absent in the prior art.

U.S. Pat. No. 3,626,321, by Smith uses interference to accomplish scanning. He shows both an acousto-optical modulation method for causing an interference pattern to scan, and a non-mechanical method, the latter being the more interesting.

His method is described in his first claim as using "a means for providing a plurality of coherent optical beams in a planar array;

means for spatially ordering said array to have equal angles and equal distances geometrically between adjacent beams;

means . . .

means for temporally ordering said array to have fixed phase and equal frequency differentials in both magnitude and algebraic sign between adjacent beams on said composite wave front so that an interference pattern scans said trace at a rate proportional to said frequency differential." (Italics ours.)

There are several difficulties in Smith's arrangement that are made more conspicuous by what is not said than by what is. The requirement for a "planar array," 'ordered spacing,' and "frequency differentials" establishes a specific scanning pattern that can be changed only by changing the frequency distribution of his multiple input beams. His arrangement does not permit computer controlled random access-type scanning because scanning is continuous, being caused by the "frequency differential." While a computer could control the scanning rate, Smith is not constructed such that it could stop and examine a scanned pixel or back up and scan a pixel again. There is not a one-for-one relationship between each action taken by the controlling computer and a specific pixel to be scanned as is disclosed by the present invention.

Further, Smith does not permit the use of 3D projection surfaces that facilitate the creation of specialized images capable of being computer-adapted for scanning specific objects.

Another difficulty with Smith's invention is that it has no provision for scanning a 3D object, has no provision for obtaining information from the object scanned, and is not addressable. In fact, he makes no mention of even two-dimensional scanning. Additional components would be needed in order to use Smith for anything beyond the unidimensional arrangement it teaches.

Smith also fails to provide a means to allow an outside device to synchronize it with the location of the scanning image, except by generating a modulating signal using slow acousto-mechanical devices, which limits both speed and accuracy of scanning.

For these reasons, Smith does not bear on novelty or obviousness of the present invention.

A far better way to scan is to use the addressable image technique of the present invention, because the scanning pattern is computer controlled, can be modified to suite a 3D object, and randomly accessed.

SUMMARY OF THE INVENTION

The present invention provides a fundamental means and method for producing a parallel decoded, addressable set of images comprising the steps of:

1. Producing a plurality of input beams of energy having at least one wavelength, and modulated with addressing information as a set of input addresses.
2. Providing an array of first pixel locations contained within a first volume.
3. Energizing each said first pixel location with at least one of said plurality of input beams.
4. Directing energy from said first pixel locations into a second volume containing an array of second pixel locations, and
5. Energizing at least one of said second pixel locations by producing at least one interference image within said second volume, wherein each interference image produced corresponds to an address of said addressing information, thereby providing an image addressor which decodes each address element of said addressing information in parallel to produce a parallel addressable set of images. The image addressor is then used to provide a number of other items.

Any wave-type energy can be used with the present invention including acoustic waves, moving particle waves, or electromagnetic waves. The basic requirement is that the energy form used must be able to produce interference. The energy type is chosen as needed for a given application. Multiple energy types may be used separately or in combination as explained below. However, in order to provide a brief and consistent explanation, optical terminology will be used herein.

There are several fundamental differences between the present invention and the prior art. Interference images are typically produced by static holograms such as embossed plastic or photographic plates. The present invention produces interference images by using a dynamic hologram projected from a three-dimensional surface, hereinafter referred to as a 3D surface. The 3D projection surface is made up of an array of first pixel locations contained within a first volume.

The hologram is dynamic in that each of the pixel locations on the 3D projection surface is independently modulated. Each combination of pixels is on, off, or set at some discrete predetermined level, and/or phase variations produce a different interference image within a second volume. Each pixel combination constitutes an address for each distinct interference image. Although the addresses are not all binary in nature, a one-for-one relationship exists between each address and the interference image it will produce. As a result, by preselecting a subset of all the possible addresses that match a set of images we wish to produce, those images can be produced on demand by modulating the input beams with the matching addresses.

A synergistic relationship exists between certain addresses, shapes of the projection surface, and the matching set of images produced. Subsets of the possible address/surface/image combinations are selected out and used in order to take advantage of a specific synergistic relationship that will enhance a specific operation to be accomplished.

In the past an invention such as the present invention was not practical because of the very large number of pixels needed in most applications, especially those described herein. Only since the invention of the Photonic Transistor, U.S. Pat. No. 5,093,802, and the very real possibility of having super-speed optical computers in the future, capable of calculating and generating the addresses fast enough, has there been the potential available for taking advantage of the full speed at which the present invention operates.

Address decoding in the prior art, be it optical or electronic generally involves a series of Boolean steps. By using matched addresses and images, the present invention decodes all elements of each address simultaneously, in parallel, to produce the addressed image in a single step. When used in a computer memory, as described below, a subset of all possible address/image combinations is chosen so that the images produced will be useful for energizing the individual memory cell components located in the second volume, where the parallel addressed images appear.

Static holograms of the prior art generally project energy either from a plane, or through a volume of clear and opaque areas such as a complex diffraction grating. The present invention uses the stationary, 3D surface for projecting energy because projecting from a 3D surface produces a set of interference images different from that which is produced by projection from a two-dimensional (2D) plane. Although any 2D plane is merely a subset of the possible 3D projection surfaces, a different relationship exists between the addresses and the images produced using one surface as opposed to using a different surface.

As an example, when the projection surface is a 2D plane, one subset of all possible addresses would be the set of addresses that produce zone plate-like patterns at the projection surface. A zone pattern produces a single point image within the second volume. If that zone pattern is moved over by one pixel, the new zone pattern constitutes an address different from the first zone pattern, because the input beams are modulated differently.

The point image produced by the second zone pattern is displaced in the same direction by one pixel's distance within the second volume. As a result, switching from one zone pattern address to another decodes so as to energize separate locations as a random access process. If an array of read and write inputs to an array of optical flip flops (see U.S. Pat. No. 5,093,802) is positioned within the second volume, the present invention can be used to decode addresses in a random access memory.

If an image component separator positioned within the second volume has a redirecting means to encode and direct energy from each second pixel location into a third volume containing an array of third pixel locations, a read only memory is produced with its output in the third volume.

If that same zone pattern is moved sequentially one pixel at a time, the second pixel locations that are in a plane within the second volume will be sequentially energized. Energy which then comes away from those energized locations carries information about each point addressed. As a result, the present invention can be used as a scanner. If an object is placed in the second volume, that object can be scanned, and information about the object retrieved.

Depending upon the application, the object can be randomly or sequentially scanned. The object can be a CD-ROM, in a non-mechanical CD player, or a piece of paper in a FAX machine. By using a set of zone pattern addresses, the entire second volume can be scanned, and information about any 3D object collected. The zone pattern addresses and their matching set of point images are an example of one synergistic relationship being used in a specific application.

When a computer is used to calculate the zone patterns and then modulate the input beams accordingly, only one zone pattern need be calculated for each plane within the second volume. The set of addresses for the point images within a plane can be generated by simply moving the zone pattern to match the desired output pixel position. If the object being scanned is in a plane, then only one zone pattern need be calculated. But what if the object to be scanned is not in the same plane?

A zone pattern projected from a 3D surface produces a different set of images than if projected from a 2D surface. A set of addresses projected from a 3D surface will have a different relationship to each other.

As an example, if the zone pattern is projected from a sphere, the single point image will lie on a single sphere within the second volume that is concentric with the projection sphere. If the zone pattern address is moved over one pixel on the projection surface, the decoded point image will not move one pixel distance within a 2D plane as before, but will rotate so as to move the image to an adjacent pixel position on the concentric sphere.

In this case, the computer needs to calculate a separate zone pattern for each radius to be energized or scanned, like layers of an onion. But only one 3D zone pattern needs to be calculated in order to scan a single radius sphere (or portion of a sphere.) This arrangement can also provide better peripheral resolution than is generally available from 2D projection planes.

Zone patterns are not the only type that produce synergistic relationships. A pattern that produces eight points per image can be used to read a full byte in parallel from a CD-ROM. A pattern which produces a square spot can be used to retrieve an entire image from a set of images. A pattern that produces a holographic type of image can be used to extract a specific image from among a number of images having information distributed over the entire scanned object just as ordinary holograms contain information about an image spread all over the hologram.

Other 3D projection surfaces produce different relationships between the addresses and the output images. Certain types of information and certain types of mathematics can be performed in parallel to produce complex images that represent the results of such calculations. By designing the shape of the projection surface, a set of useful output images can be produced that are easier to work with in subsequent processes than if that same data-defined address is projected from some other 3D or 2D shape.

By matching the set of addresses, with a particular projection shape with the interference images that will be produced, the ROM or RAM arrangement described above can be used as a content addressable memory. The content addressable memory uses data as the input addresses which in turn looks up other data which is provided as the output.

A series of such content-addressable memories can be used to provide an iterative series of calculations by connecting a plurality of content-addressable memory stages with the output of each one driving the input of the next. A portion of the last stage is directed back into the first stage.

A portion of outputs from at least one of the stages supplies the output from the series, and a portion of at least one of the inputs of at least one of the stages provides input for the series.

Each stage calculates a 3D image from a 3D address. The time it takes for each calculation to be performed is only the time that the energy takes to traverse one stage. Following a series of stages and time delays, information from the last stage feeds back into the first stage. This causes the first stage to recalculate a new 3D image and input for the second stage, and so on. As a result, the process is iterative. Such calculations will continue until the composite input address of the first stage is the same for successive iterations. At that time, the output will have stabilized.

Because the iterative process proceeds through time and calculates 3D information at each stage, the process can rightly be called "four-dimensional computing."

The basic invention can also be used as a 3D visual display by using visible light of at least one color. Given a large number of input pixels, a very large number of images can be produced. In fact, any image can be produced within the resolution of the arrangement, given the ability to calculate or otherwise produce its address. By sequentially addressing a set of images, motion can be simulated.

Another important use for the present invention is for directing digital information into various communications channels. For example, a photonic digital signal may need to be directed into one of several optical fibers. This can be accomplished using the basic ROM configuration.

Two sets of addresses are chosen such that using digital data to modulate a portion of the input beams that make up a complete address causes the output image to energize first one decoded address position, and then another. This produces a pair of addressable outputs that are alternately energized and deenergized depending on whether the digital data is high or low. Outputs taken from these two addressed locations are the inverse of each other. When one is on, the other is off. Either one of these outputs can be directed into a communications channel such as an optical fiber.

The other portion of the complete address constitutes a channel address. Changing the channel address causes the selection of a second pair of addresses, one of which is directed into a second communications channel. Address pairs can be selected for as many channels as are needed. Selecting a channel address will cause the digital data to appear in the selected communications channel.

There are many means available for changing the shape of the projection surface within the first volume. One way is to predetermine which shape is most advantageous for the tasks each apparatus is to perform and to construct an optical element having the desired shape, including a means for directing each of the individual input beams to its proper pixel location from which the energy is directed toward the second volume where the composite image will be formed.

Another projection surface changing means is to position within the first volume a substance the optical properties of which can be changed so that the position from which each pixel is projected can be changed either dynamically or by means of some outside process, such as photographically. The exact method chosen depends upon the need for change, the speed at which change is required, and whether or not a high speed or previous calculation of a different address set is able to provide a similar output image from a single projection surface.

The projection surface can certainly be divided into separate areas with different shapes that can be addressed separately to provide different image sets.

Some of the objects to be accomplished by the present invention are as follows.

One of the objects of the present invention is to provide a means, method and apparatus for producing a set of addressable images, both complex and simple, using a three-dimensional (3D) address to produce 3D images.

Another object is to produce a computer memory having parallel decoded addresses, both ROM and RAM.

Another object is to provide a content-addressable memory.

A further object is to provide the capability of accomplishing four-dimensional computing.

Another object is to provide a means, method and apparatus for scanning a volume.

Another object of the present invention is to provide a means, method and apparatus for scanning an object.

Another object is to provide a means, method and apparatus for producing a visual display through complex image addressing.

A further object is to provide a means, method and apparatus for phase demultiplexing, filtering and correction.

Another object is to provide a means, method and apparatus for converting an addressable image from one energy form or frequency to another.

A further object of the present invention is to provide a means, method and apparatus for channel switching of digital information.

The foregoing objects and benefits, as well as further objects and benefits of the present invention, will be made more manifest by the description of the preferred embodiment and claims which follow.

BRIEF DESCRIPTION OF THE DRAWINGS

It should be noted that the beam angles, sizes and proportions are exaggerated in the drawings so as to provide clarity of understanding. A precept utilized as a "given" is that a three-dimensional (3D) projection surface can be a spherical projection surface.

FIG. 3. is a perspective view showing 2D address decoding of point images.

FIGS. 4A, 4B and 4C show the synergistic relationships between addresses and images using the present invention.

DESCRIPTION OF THE PREFERRED EMBODIMENT

1. Basic Embodiment.

Figure 1:
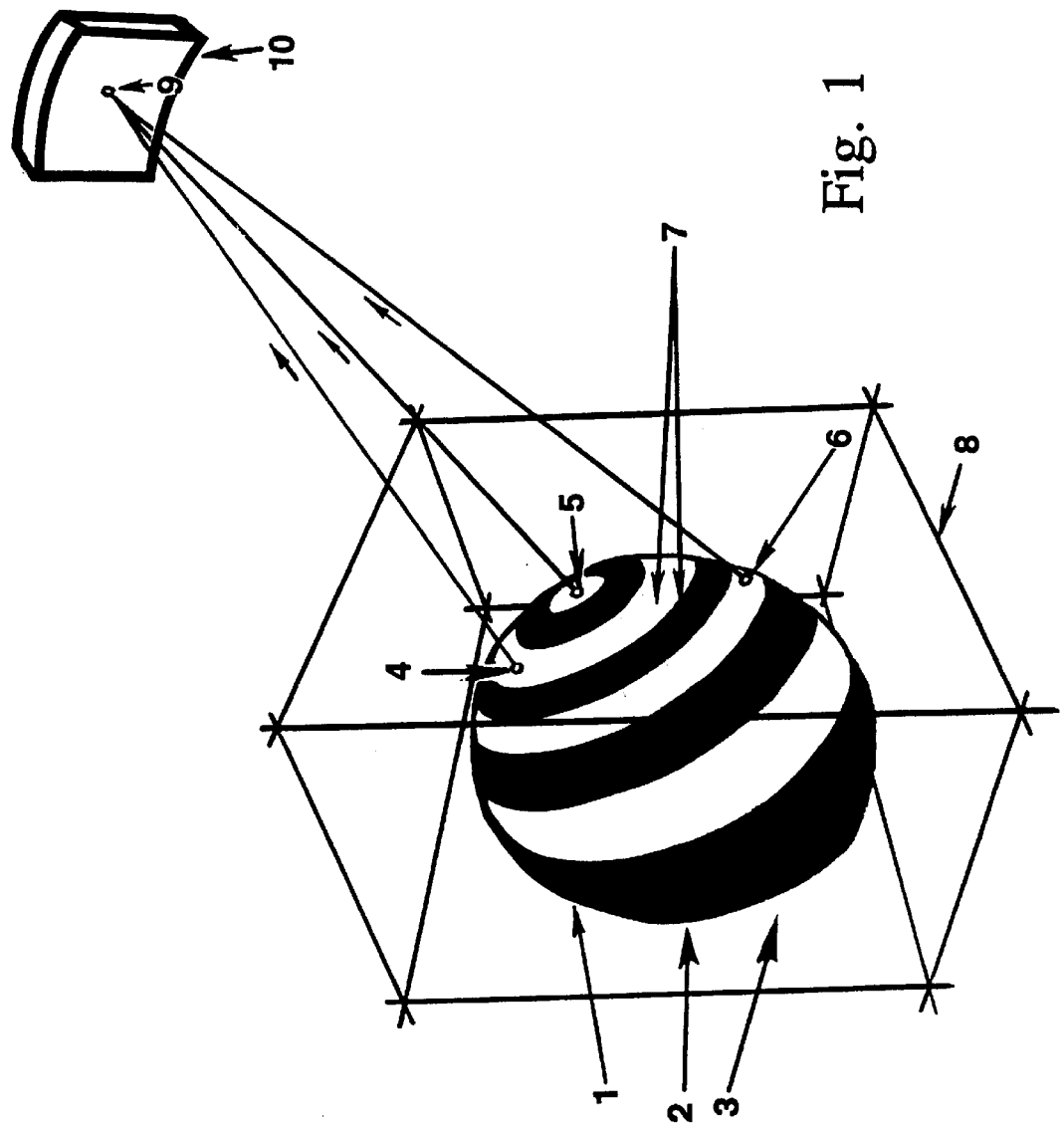
FIG. 1. is a perspective view showing three-dimensional (3D) address decoding and image formation.

FIG. 1 shows the basic image addressor for the production of an addressable image set. A large set of input beams energize a first set of pixels which cover a 3D projection surface (7), in this case a sphere within a first volume (8). Each of the independently modulated beams energizes at least one pixel on the 3D projection surface (7). Three of the many independently modulated input beams (1), (2), and (3) are shown. These input beams energize pixels, such as pixels (4), (5), and (6), to produce a complex 3D address pattern on 3D projection surface (7), which in this case is a spherical zone pattern.

Energy is directed from each of these first energized pixels into a second volume (10), here shown as a small portion of a spheroid. Any optical element or group of elements can be used to direct the energy from each pixel into the second volume (10), so that an interference image can be produced within second volume (10) by interference among the many rays that emanate from the 3D projection surface (7). Other optical elements such as lenses, mirrors and holograms can also be used between the first and second volumes to facilitate image formation.

In this way, the input address produces a complex 3D address pattern at the 3D projection surface (7) made up of all the energized pixels in the complex 3D address pattern at (7). In turn, the energy is projected therefrom to produce an interference image (9), in this case a point image.

By modulating the input beams with a different address, a different address pattern appears at the 3D projection surface (7). As a result, a different interference image will be produced in second volume (10). The set of all possible addresses will produce a matching set of all possible images that can be projected from the single 3D projection surface (7). Because there is a one-for-one relationship between the input addresses and the images produced, the present invention provides a means and method of producing an addressable set of images.

The projected energy, in turn, energizes certain pixel locations within the second volume (10). When the second volume (10) contains an object, the interference image (9) appears on or in the object, energizing pixel locations on or in the object. If a series of photographic or holographic images are addressed on or in the object, then the object can be scanned, and/or selectively energized and projected out from the object in the scanning sequence. (This secondary projection is shown in greater detail below with reference to FIG. 8.)

Specific subsets of all possible addresses and images are useful for accomplishing specific tasks because a synergistic relationship exists between certain address patterns and the set of interference images which are useful for a specific task. Some of these synergistic relationships are considered in greater detail below. An example shows the uses of a different projection surface within volume (8). This new 3D projection surface (13), shown in FIG. 2, is produced by using a different set of "first" pixels within volume (8) from which to project the energy of each address beam.

Figure 2:
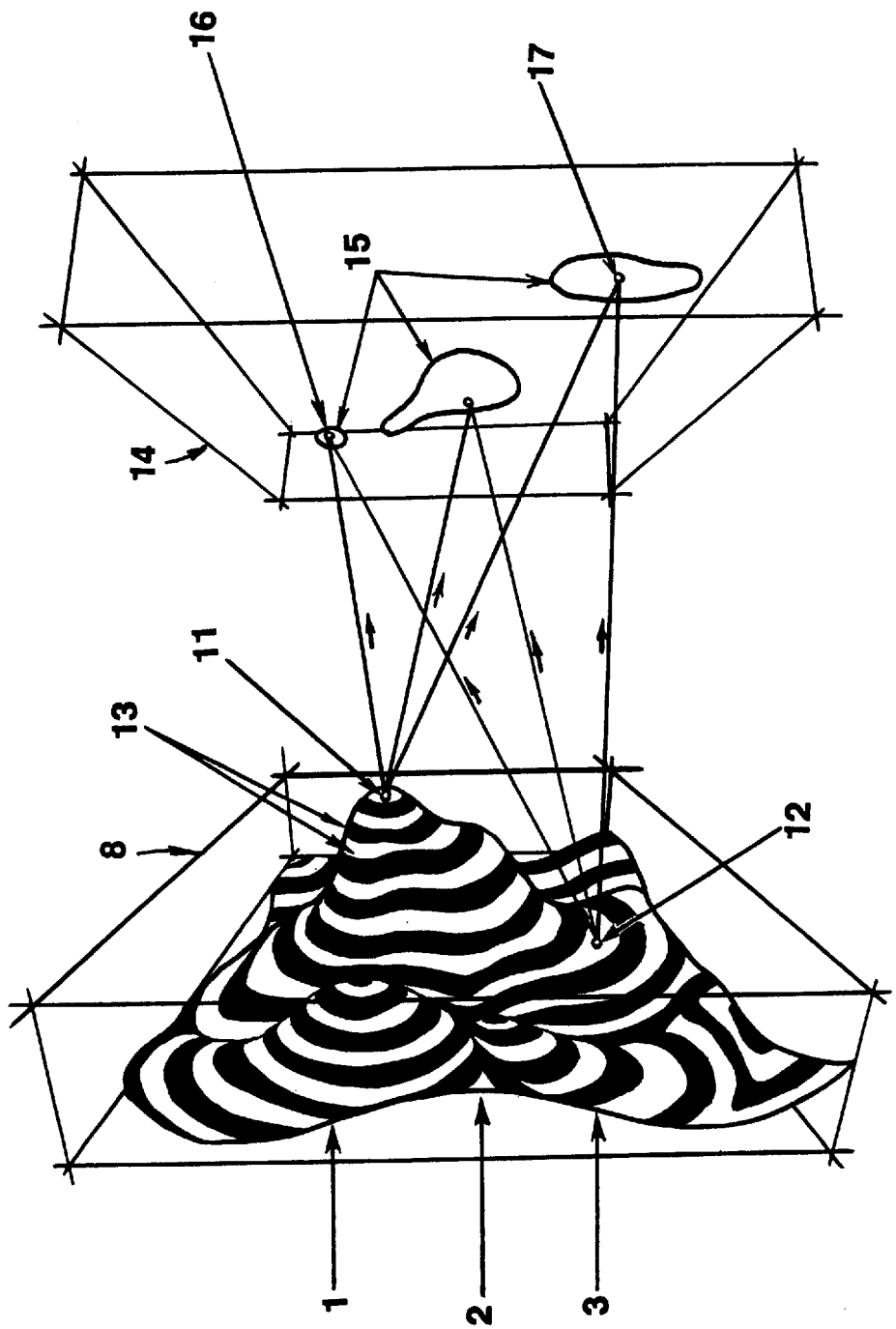
FIG. 2. is a perspective view showing two-dimensional (2D) address decoding and image formation.

Changing the locations within the first volume (8), such as (11) and (12), from which energy is projected toward the second volume (14), changes the shape of the 3D projection surface (13) (compare FIG. 1 with FIG. 2.) In FIG. 2, the addressed interference image within volume (14) is image (15), in this case a three-part image. Because the shape of the projection surface is different from that shown in FIG. 1, interference image (15) is different from interference image (9) of FIG. 1. Thus, changing the shape of the projection surface changes the set of images produced from the same set of input addresses.

The new pixel locations within volume (14) that make up the addressed image are energized. Example pixels including (16) and (17) are shown. Volume (14) is shown as having a size and shape different from that of volume (8) to show that a volume of any size or shape can be used.

Providing the same input address to a 3D projection surface such as that shown in FIG. 1 will produce a different address pattern on the projection surface than if that same address is projected from the 3D surface shown in FIG. 2. The same set of input addresses will produce a set of addressed interference images in FIG. 1 different from those in FIG. 2. But whether the 3D projection surface (7) of FIG. 1 is used, or the 3D projection surface (13) of FIG. 2 is used (or some other projection surface), a one-for-one relationship exists between the address selected and the interference image produced.

The projection surface can be produced either statically, by manufacturing a set of optical elements to project from the desired surface, or dynamically, by using a means for dynamically changing the optical qualities of a substance, or by placing mechanisms within the first volume (8).

By selecting subsets of all the possible address and pixel projection locations, a subset of the possible images are selected. One such subset may be especially useful for a given application, whereas a different subset may be useful for a different application.

FIG. 3 is a case in point, where the synergistic relationship between one address and another is illustrated. Here a standard bulls-eye zone pattern is projected from a 2D projection surface (21). As in the previous illustrations, example input beams (1), (2), and (3) are projected from pixel locations (18), (19), and (20) respectively. They form a part of the address pattern (21) which is made up of many such input beams.

The address pattern (21), being a zone pattern, projects energy (22) into volume (23) to form a point image (24). If the address is changed through a change in the input beam modulation pattern, such that another zone pattern (27) is projected as shown by lines (28) from the same projection surface but offset by one or more pixels (compare pixel (18) with pixel (25)), the point image addressed will be offset by the same number of pixels, from (24) to (26).

As a result, every point within volume (23) can be randomly accessed and energized by providing the proper input address modulation pattern. The same is true of the points in volume (10) of FIG. 1. However, the relationship between one address and another is different in each of the three FIGS. 1, 2, and 3, because the projection surfaces are different. FIGS. 4A, 4B and 4C illustrate how a synergistic relationship between address, images, and projection surface pixel locations can be useful.

FIGS. 4A, 4B, and 4C show how three point images (30), (31), and (32), on arc (33), are energized using three different methods.

FIG. 4A shows the prior art method. A zone plate hologram in position (34) produces a point image at (30). Moving the image over one pixel on arc (33) to pixel (31) requires that the hologram be mechanically revolved to position (35). To energize pixel (32), the hologram would have to be revolved to position (36). The present invention requires no mechanical movements.

FIG. 4B shows a cross-sectional view of the projection plane of FIG. 3. The projection surface (21) has a zone pattern address that produces point image (30). Another zone pattern address will energize pixel (31), and a third will energize pixel (32). However, (30), (31), and (32) do not lie in a common plane the way (24) and (26) do in FIG. 3. As a result, the computer which calculates the addresses must recalculate each zone pattern. Therefore, the relationship between addresses in FIG. 3 is different from that in FIG. 4B.

FIG. 4C is a cross-sectional view of a 3D projection surface (7) like that of FIG. 1. Here, a slice of the 3D projection surface (7) is shown. The addressed images appear in a spherical volume which includes arc (33) and is concentric with the 3D projection surface (7).

Only one spherical zone pattern need be calculated in order to access the three pixels (30), (31) and (32), because circle (33) is concentric with 3D projection surface (7). Moving the spherical zone pattern to center on a particular projection pixel causes the point image to rotate to its matching location on (33). As a result, the synergistic relationship between addresses, the projection surface, and the addressed images is used to energize points on a sphere, whereas a different synergistic relationship is used in FIG. 3 to energize points in a plane.

Thus, an appropriate address combination subset, a subset of projection pixels within the first volume (8), and the images produced within the second volume (23) can be selected for any given application that take advantage of synergistic relationships between the addresses, projection surfaces and addressed images.

Figure 5:
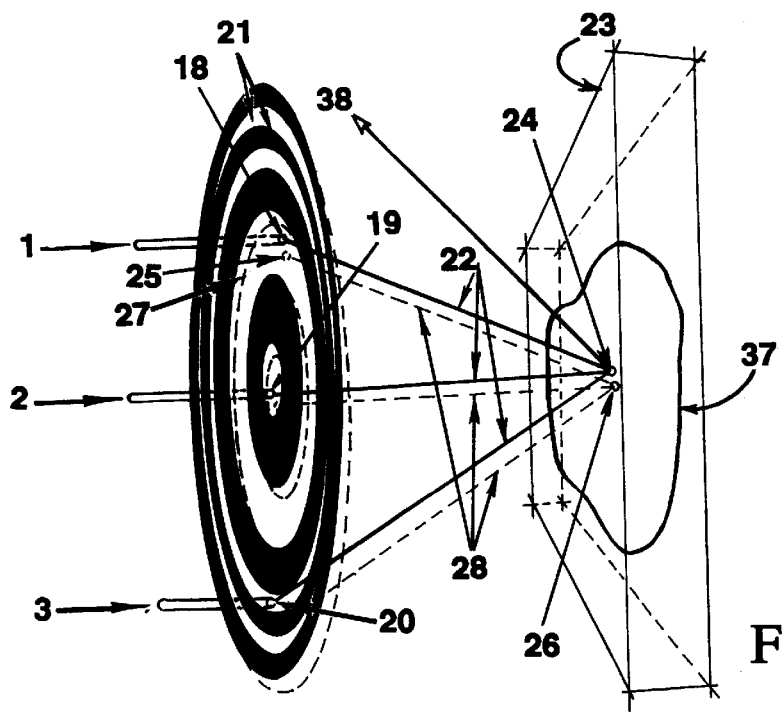
FIG. 5. shows how an object is scanned.

FIG. 5 shows an object (37) inserted into the second volume (23). Any object that reacts with the energy form being used will work. If sound waves are used, the object could be a jelly fish; if electrons are used, the object could be a specimen in an electron microscope; if light is used, the object could be a pancake placed in a non-mechanical FAX machine. A point image such as (24) is addressed. Energy is reflected, refracted, or otherwise directed to some common location (38) depending on how the object reacts to energy at the addressed location.

That energy carries with it information about location (24). If it is light or dark, the corresponding pixel in the remote FAX machine is set light or dark. With the selection of another address pattern (27), another spot on the object can be analyzed by energizing (26).

Depth within the scanned volume can also be determined by the fact that a point image will be out of focus when striking an object that is either too close or too far away from the focal point of the image. The differences can be detected by comparing the results of a set of images at different depths within the volume, so that the computer can then determine which address produces a sharp, in-focus image on the object, which in turn provides the computer with depth information about the object. Then, by addressing all of the locations on the object, enough information can be gathered so that a computer can recreate a full image of it, even in 3D if the computer has 3D display capabilities.

While most people would not have much use for a 3D FAX of a pancake, the information gathering ability of the present invention can be used to provide 3D imaging of human internal organs for medical applications, pictures of trout in a lake, or any other hidden or remote object.

If the object is scanned with multiple wavelength energy, information about the composition of every addressable spot on the object can be obtained as in a spectrograph, so that the imaging computer can reconstruct an image that details the spectrographic qualities of every point on the scanned object. From such information, the imaging computer that receives the information from the present invention can determine what recipe was used to make the pancake, or any other attribute or quality of the pancake.

The resolution of the scanner depends upon the shape and size of the projection surface and the number of pixels in the address pattern, which determines the sharpness of the addressed image. Such images can be made quite small or quite large as needed for scanning small and large objects.

Computer controlled scanning using the present invention can be used to collect data from an object and then produce a full image of the object in the same or a different location.

For example, a turkey can be placed in a microwave oven and scanned to determine the shape and location of the drumsticks. The controlling computer can then produce an addressable image set using microwave energy. Then the drumsticks can be cooked with less energy or for a shorter period of time than the rest of the bird, which is cooked with a different set of addressable microwave images addressed for a different length of time, all the while producing a visible image of the bird at a different location so the cook can see how things are going without needing a window in the microwave.

As with the turkey example above, an object can be scanned with one energy type for one reason, such as information retrieval, and scanned with another image set and another energy type for another reason, such as cooking the bird. The computer can even scan the object to determine its exact shape, and from that information calculate the address of an image of the entire object. If the image address is directed to another embodiment of the present invention used as a visual display, a complete holographic 3D image can be produced. If the image is projected onto the location of the object itself, the object can be changed by the energy from the projected image. For example, a microwave image of the turkey can concentrate microwaves where they are needed so that a lower power magnetron can be used to do the cooking in a shorter period of time.

If a line is scanned with an addressable image set of laser light of the appropriate power and wavelength, the computer can also slice the turkey.

The present invention has these unique abilities, among others:

1. Computer controlled interaction between the production of image addresses and the images produced;
2. The ability to use various forms of wave-type energy for producing various reactions with the scanned object;
3. The ability to scan an object and provide dynamic information about that object;
4. The ability to provide information about an object so that the computer can calculate a succeeding set of addresses and images to accomplish additional tasks related to the scanned object, and
5. The ability to produce addressable 3D images at a location remote from where the original object has been scanned.

Figure 6:
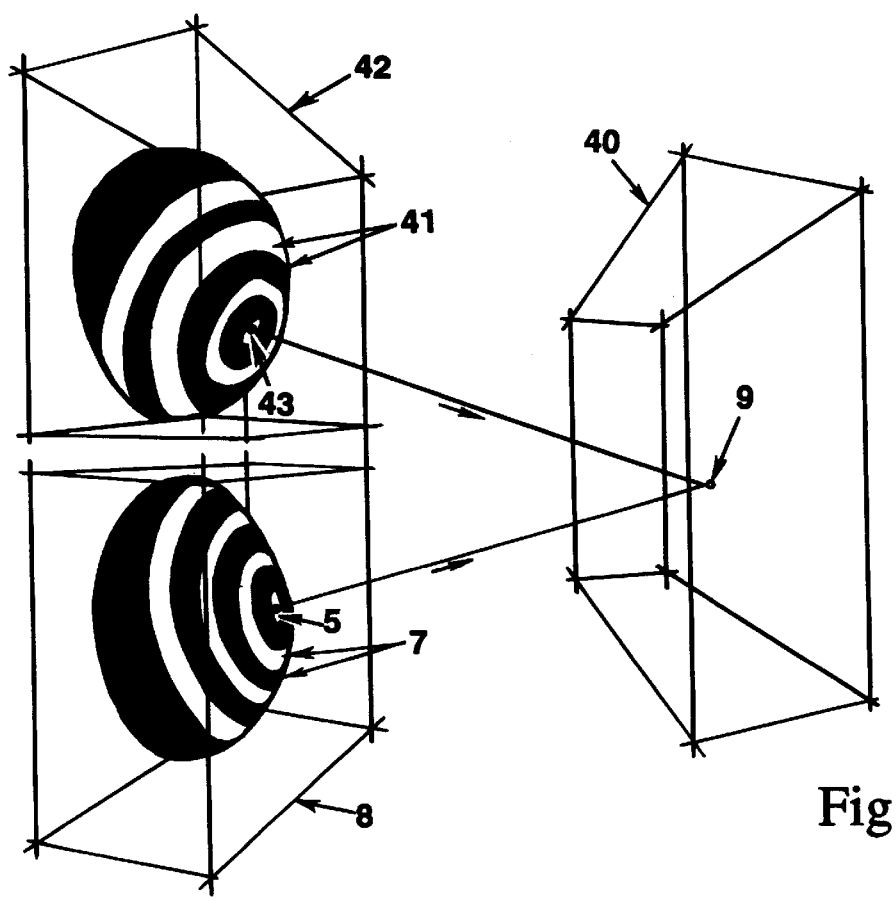
FIG. 6. Illustrates multiple projection surfaces for using multiple energy forms.

FIG. 6 shows one way in which multiple energy forms can be used to provide images within a common volume. One 3D projection surface (7) in volume (8) can be used to address a pixel location within the common volume (40). Another image projecting surface (41), with energized pixels such as (43), with the same, or a different shape, using a different energy form or wavelength can be projected to the same image pixel location (9).

Each of the energy forms can be used for a separate purpose. For example, an object in volume (40) can be scanned with one energy form and then illuminated with another energy form. There are many uses for multiple energy applications of the present invention. For example, an object which reacts to only an invisible wavelength can be scanned at that wavelength and illuminated at the same points with a visible wavelength which would make it visible.

A reaction can be induced by one wavelength and scanned at another, as in the turkey example above. Computer interaction can cause the component parts of an object to be treated differently by selectively calculating the proper address patterns and producing images of the various energy forms as needed.

The ability of some substances to react differently to different energy forms provides the present invention with the ability to transfer information from one form to another, or from one frequency to another. A substance can be selectively scanned to write information into the substance, which is then read by scanning with the second energy form or frequency.

Figure 7:
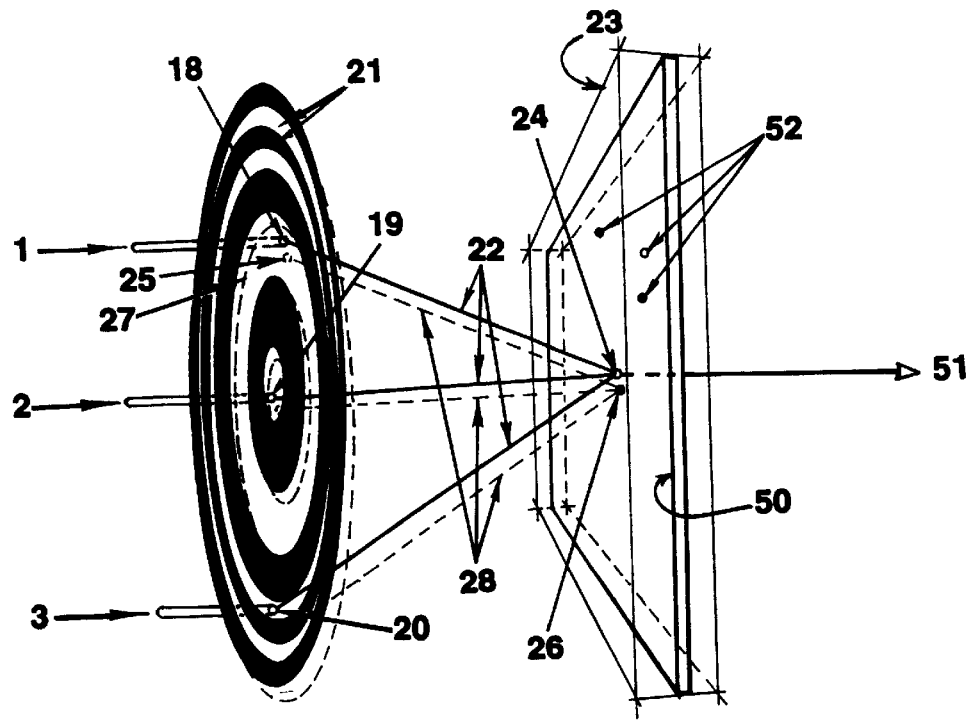
FIG. 7. Illustrates address decoding for a memory or other object.

FIG. 7 shows an example of address decoding for a ROM The address patterns are produced as in FIG. 3, using the same numbers to identify the same components.

An address subset is chosen that produces point images within volume (23). An image component separator (50) in volume (23) is either transparent or opaque at the example second pixel locations (24), (26), and (52). If the addressed pixel is transparent, then the output (51) will be energized. If the pixel (26) is opaque, then no energy will be passed through the image component separator (50). Addressing can be sequential or random because of the one-for-one relationship between addresses and addressable images.

Figure 8:
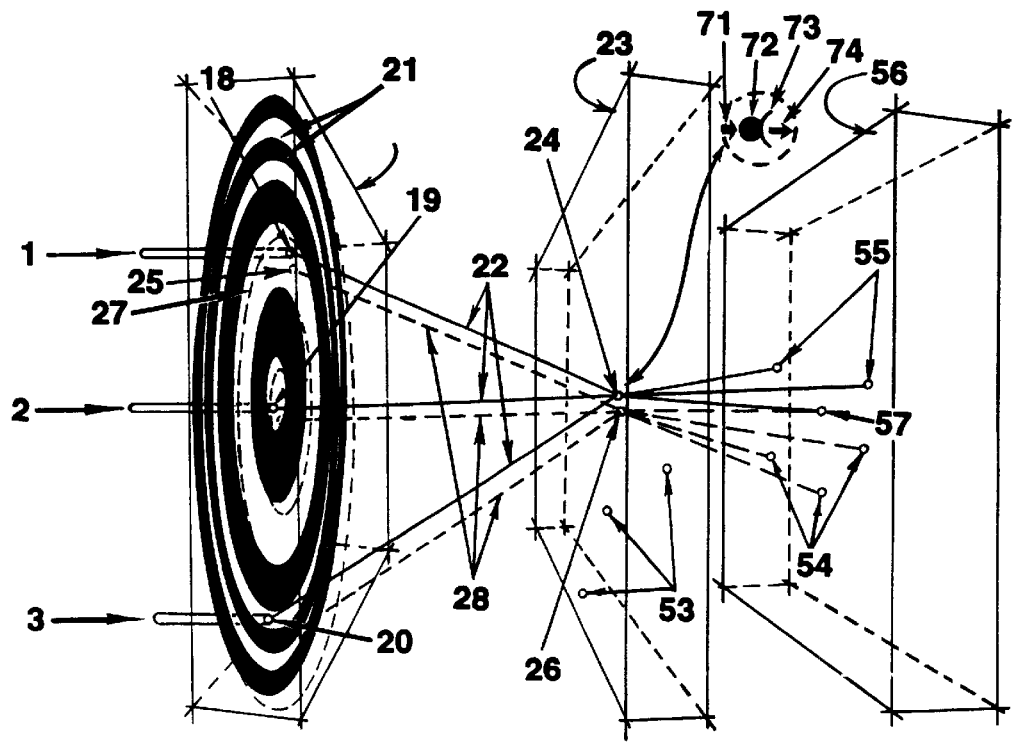
FIG. 8. shows how an output image is produced from a single addressed position.

An address set can be chosen that energizes eight or more pixel locations of the image component separator (50), or energy from one addressed pixel can be redirected in eight different directions. As a result, an entire byte, word, or even another image may be read into output (51). FIG. 8 provides a clearer view of this process.

FIG. 8 also shows how the present invention can be used to address and read information out of a ROM, with only a few of its addressable locations shown in volume (23). Each addressable location (24), (26), and others such as (53), have directing elements that direct energy to specific third pixel locations in a third volume (56). One addressable location (24) directs energy to several output locations (55) and (57). Another addressable location directs energy to a different set of output locations (54) and (57). These outputs are capable of providing parallel information, such as the bits in a byte or word, some being energized from one address and others not.

The present invention can be used to accomplish many tasks depending on what is being addressed. In the example above, each addressed pixel, such as (24) and (26), is either transparent or opaque, and the result is a ROM. In the example shown in FIG. 5, the object can be reflective or non-reflective such as a CD-ROM, a piece of paper in a FAX machine, or some other object to be addressed or scanned using sequential addresses. In FIG. 8, the pixels are able to project multiple output beams that can represent binary data, or can be an entire image such as a holographic or photographic image. It all depends upon the optical elements at each pixel location in (23).

The object scanned can also be an array of optical flip flops such as those taught by the prior art. Such flip flops are disclosed in U.S. Pat. No. 5,093,802. When volume (23) has an image component separator filled with such flip flops and the optical circuitry needed for reading and writing to the flip flops, the present invention will provide parallel address decoding in a one-step access to each memory cell location.

One set of addresses direct energy to energize pixels that trigger the setting or resetting of the flip flops, and another set of addresses energize pixels that trigger a read output. As a result, the present invention can be used as a means and method of parallel, one step addressing for both ROMs and RAMS, or for any other optical computing mechanism that requires address decoding.

Certain types of substances respond differently to different frequencies or types of energy. A photo-reactive substance located in volume (23) of FIG. 8 or volume (40) of FIG. 6 can react to energy of one frequency that causes the pixel location to become clear or opaque. Then energy from another frequency, or even from another projecting surface, can read the information stored at those locations.

The addressed images also have the quality that the concentration of energy occurs at the image location. When a substance is placed in volume (23) that reacts to energy only at certain levels, the present invention can address images that match those levels only at the focal point of the image and not at other points along the way, or beyond image focal point. As a result, the present invention can be used to selectively access, energize and even modify locations within the entire volume (23), and not just a surface within that volume. Such substances, which are common in the prior art, can now be used more effectively because of the present invention. In computing non-mechanical mass data storage device (hard drive) can be made with the aid of the present invention.

Signal processing is also an important use for the present invention. One example is the phase filter. In this case, phase modulation is used to modulate the input address beams. A set of pixels in volume (23) are addressed. At these locations, energy is redirected as in FIGS. 7 and 8. The optical elements at these locations are able to direct energy into the output having an amplitude and phase the same as or different from that present at each addressed pixel.

As a result, a phase-modulated set of input addresses are able to produce a phase- and amplitude-adjusted output in any desired sequence. For example, if a phase-fluctuating input can be used to produce an address set having a phase-adjusted output, it can be adjusted so that the output from all pixels produces a constant phase combined output or different outputs, as in demultiplexing phase multiplexed information. By providing a phase-fluctuating signal to a portion of the input address beams and a constant phase signal to the others, a set of addressable images can be produced that relate the constant phase energy to the fluctuating phase energy.

An important application in phase filtering is in producing phase logic through an address look-up process, and in phase locking two signal sources together.

A similar application, channel switching, can make use of both phase and amplitude modulation, (as do the rest of the embodiments of the present invention.)

To accomplish channel switching, a subset of addresses is selected such that one portion of the address set is controlled by data, and the other portion is controlled by computer generation of the addresses. The result is that address pairs are established when the data represents serial binary bits. The computer-generated portion is actually the common portion of an address pair.

The data-driven portion of the address causes the selected address to alternate between one and the other of the addresses of the address pair. Each address is decoded by the present invention to produce two images that are alternately energized and de-energized. As a result, outputs taken from the addressed pixels are the inverse of each other. When just one of the addressed pair pixel locations in volume (23) is directed into a communications channel, the serial data will exit the address selected output only when the computer-generated portion of the address pair has been selected.

Each address pair provides at least one channel output so that, by selecting an address pair, the serial data can be switched to one of several output channels.

Addressable imaging can also provide a valuable visual display function. Energy of at least one color, and often more, is used to address an image within volume (23). The images produced can be 3D holographic images or 2D images addressed at the surface of a viewing screen placed in volume (23), like (50) in FIG. 7. If the input address has a large number of address beams, an even larger number of images can be addressed and displayed. A subset of all the possible addressable images can be used to provide a set of specific pictures we wish to display.

Another important application of the present invention is in converting one energy form to another. A first energy form is input at the plurality of input beams, including (1), (2) and (3), of FIG. 8, and subsequently to pixel (24) which is (72) in the inset close up view of (24). This first energy form (71) energizes pixel (72), which causes a second form of energy to output (74) from the energy convert means (73).

The energy converter means can be a crystal that converts light at one wavelength to light at another wavelength. It could be a phosphor that converts electrons to light, or any other means for inputting one form of energy and outputting another. The term form used in this context includes energy types such as sound and light and different frequencies of the same energy type such as red light and purple light.

What ever image is addressed, the energy which makes up the image energizes all of the pixels in the image. Because the output from the individual pixels, having the new energy form, are in the same positions as the energized pixels they form a composite output image in the new energy form, even if the image is of a single point as pictured.

Whether an energy conversion is used or not in FIG. 8, the output pixels are a third set of pixels that are also in 3D locations within volume (56). The purpose of this third volume is to allow multiple stages of the present invention to be interfaced together, the 3D output of one stage being provided as a 3D input for the next stage. When the addresses and information output are coordinated by selecting an address set to match input data, that in turn produces data output, resulting in a content-addressable memory.

Figure 9:
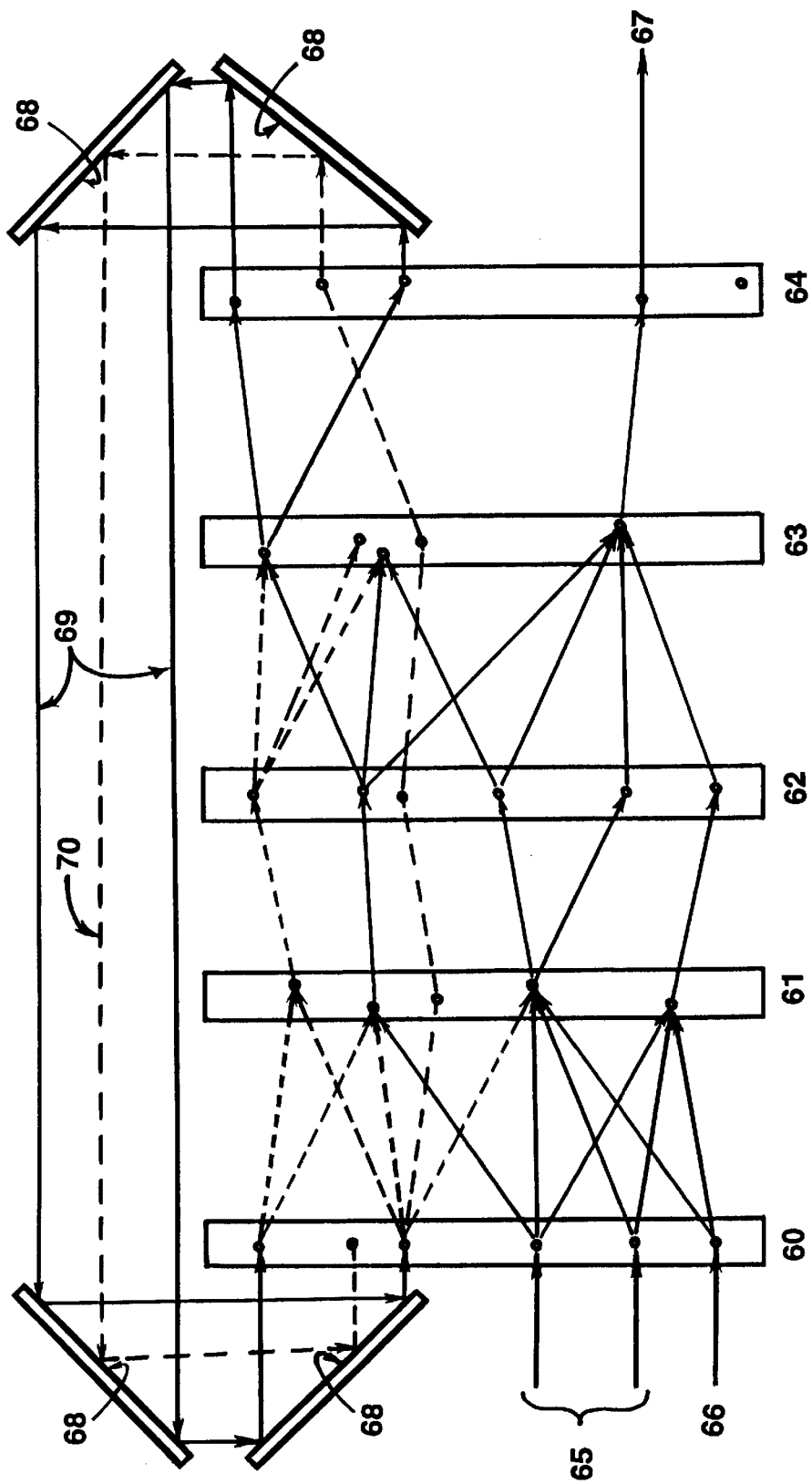
FIG. 9. illustrates the iterative process of the present invention which provides four-dimensional (4D) computing.

FIG. 9 shows two content-addressable memories connected in an iterative series. Input volume (60) corresponds to (58) in FIG. 8, (61) to (23), and (62) to (56). This represents a first content-addressable memory in this iterative series. A second stage consisting of volumes (62), (63) and (64) represents a second content-addressable memory.

Input (65) supplies energy to the series as a portion of the input address presented to the projection pixels in volume (60). A second input (66) provides a data input. Together, (65) and (66) provide an initial address pattern which is decoded to produce a first image in volume (61), as shown by the solid lines between (60) and (61).

Data is accessed in volume (61) which is output to volume (62), just as was accomplished in FIG. 8. Volume (62) serves two functions. It is the output volume for the memory (60), (61) and (62), and it is the input volume for memory (62), (63) and (64), which also operates as FIG. 8 operates.

From one of the output volumes, (64) in this case, an output is taken from the entire iterative series at (67).

The information addressed from volume (61) is used to address a second set of information in volume (63). The solid lines between volumes (62) and (63) depict the decoding of the address pattern for the production of the interference image in volume (63). They correspond to lines (22) in FIG. 8.

Information from volume (63) is accessed, being output at (67). A portion of the information retrieved from volume (63) is (69) and is directed by mirrors (68) to feed back to the beginning, to input volume (60), which causes a new address to be presented to volume (60). This is the first iteration, and is depicted by the solid line arrows in the drawing.

A time delay occurs between the time that the initial address is presented from inputs (65) and (66) and the time that the new address is presented by the arrival of energy (69) at input (60). That time delay is the time which it takes the energy to traverse the iterative series (60) to (64) and present a new, modified address to input volume (60). This is the first iteration.

The second iteration is shown by the dotted lines and arrows. Now the new address at (60) is decoded and new information retrieved from volume (61), which presents a new address at volume (62) for processing in the second content-addressable memory. This extracts new information from volume (63), which is fed back along line (70) to present yet another address to input (60). This is the second iteration.

This iterative process continues to step through the information in volumes (61) and (63), presenting a continuing group of addresses looked up at each stage, until two identical addresses have been presented, or an identical series of addresses are produced. At that time, the output at (67) contains the result of the iteration, be it a single data set that continues to be presented at (67) or a series of data sets presented over and over through output (67).

Many such stages can be interconnected in order to produce iterations, and more complex organization of stages and iterations can be managed by means of interconnecting the memories in more complex patters.

What is calculated depends on the data included in the content-addressable memories, but a great variety of iterative processes can be accomplished through selection of synergistic address/data/image and projection surface combinations.

There is no reason that a greater number of stages cannot be included in the series, or that multiple feedback paths cannot be used, or that RAM as well as ROM stages cannot be used. In fact, any beam controlling means and methods can be included in order to provide address timing or changes in the information to be calculated.

The production of an interference image constitutes a parallel calculation of input information in three dimensions. Whether that input information is, strictly speaking, an address or is data coordinated as addresses, the inputs as well as the outputs occur in three dimensions. The fourth dimension is time, and the time delay for energy to traverse each stage provides that fourth dimension. Therefore, the present invention provides four-dimensional computing.

As can be seen, a number of unique features make the present invention very useful. These include, among others:

1. Direct computer control of 3D image production;
2. Independent, computer-controlled modulation of input beams;
3. 3D projection surfaces;
4. One-for-one address pattern/projection surface and interference image relationships;
5. Making addressable images;
6. Using subsets of addressable images in synergistic relationships;
7. Parallel decoding of image addresses;
8. 3D images in, 3D images out;
9. Four-dimensional computing;
10. Address sequence scanning;
11. Multiple energy form use;
12. Computer-interactive sensing and re-imaging;
13. Imaging for the purpose of modifying an object;
14. Sorting channels through addressing, and
15. Signal processing.

While the foregoing description of the preferred embodiment of the present invention has disclosed specific constructions, means, and methods of accomplishing the present invention, because specific improvements and modifications will become readily apparent to those skilled in the art of computers and optical devices and the like, it is applicant's intent not to be limited by any of the foregoing descriptions, but only by the claims which follow.

What is claimed is:

1. A method of producing a parallel addressed read-write memory using a parallel addressable set of images comprising the steps of:

producing a set of input beams of energy having at least one wavelength modulated with addressing information as a set of input addresses;

using said set of input beams to energize an array of first pixel locations arranged along a projection surface contained within a first volume, so as to form a dynamic hologram, said dynamic hologram being produced by energizing different subsets of said set of input beams which in turn energize different subsets of said first pixel locations to produce holographic configurations corresponding to addresses of said set of input addresses;

directing energy from said projection surface to produce interference images which energize at least one pixel location within an array of second pixel locations within a second volume;

addressing a subset of said set of input addresses corresponding to a subset of said interference images which energize a subset of said second pixel locations;

positioning within said second volume an image component separator having a redirecting means to encode and direct energy from said second pixel locations into a third volume containing an array of third pixel locations to provide at least one address-selected output containing encoded information;

selecting two subsets of addresses from said set of input addresses to provide a read-address subset and a write-address subset, and positioning within said second volume a means for storing information at said second pixel locations which responds to energy from said write-address subset by storing said information and which responds to energy from said read-address subset by outputting said information through said at least one address-selected output.

2. An image addresser comprising:

input means for providing a set of input beams of energy having at least one wavelength and modulated with addressing information to provide a set of input addresses;

a projection surface having an array of first pixel locations therein, contained within a first volume, said first pixel locations being energized by said set of input beams;

a dynamic hologram produced by energizing different subsets of said set of input beams which in turn energize different subsets of said first pixel locations to produce holographic configurations at said projection surface corresponding to addresses of said set of input addresses;

a second volume having an array of second pixel locations therein;

a set of interference images that correspond to said set of input addresses which are produced by projecting energy from said dynamic hologram at said projection surface into said second volume energizing said array of second pixel locations;

a third volume having an array of third pixel locations, each of said third pixel locations being capable of being energized when subjected to energy;

an image component separator positioned within said second volume, having a redirecting means for encoding and directing energy from said second pixel locations into said third volume;

said second and third volumes being positioned and oriented with respect to each other so that, when said addressing information includes a subset of input addresses corresponding to a subset of said interference images, said energy from said second pixel locations in said second volume is directed to a subset of said third pixel locations, and said second volume including information storage means for storing information at said second pixel locations which responds to energy from a write-address subset by storing said information contained therein and which responds to a read-address subset by outputting said information stored at said information storage means through at least one address-selected output.

* * * * *